United States Patent
Peuchant et al.

(10) Patent No.: US 9,941,721 B2
(45) Date of Patent: Apr. 10, 2018

(54) SYSTEM FOR MANAGING THE CHARGING OF A STORAGE BATTERY

(71) Applicant: RENAULT s.a.s., Boulogne Billancourt (FR)

(72) Inventors: Thomas Peuchant, Paris (FR); Yves Le Vourch, Le Chesnay (FR); Antoine Saint-Marcoux, Palaiseau (FR)

(73) Assignee: RENAULT s.a.s., Boulogne Billancourt (FR)

( * ) Notice: Subject to any disclaimer, the term of this patent is extended or adjusted under 35 U.S.C. 154(b) by 302 days.

(21) Appl. No.: 14/389,512

(22) PCT Filed: Mar. 26, 2013

(86) PCT No.: PCT/FR2013/050652
§ 371 (c)(1),
(2) Date: Sep. 30, 2014

(87) PCT Pub. No.: WO2013/144499
PCT Pub. Date: Oct. 3, 2013

(65) Prior Publication Data
US 2015/0054470 A1 Feb. 26, 2015

(30) Foreign Application Priority Data
Mar. 30, 2012 (FR) .................................... 12 00971

(51) Int. Cl.
*H02J 7/04* (2006.01)
*H02J 7/16* (2006.01)
*H02J 7/00* (2006.01)
*G01R 19/165* (2006.01)

(52) U.S. Cl.
CPC ............ *H02J 7/007* (2013.01); *H02J 7/0014* (2013.01); *H02J 7/0016* (2013.01); *H02J 7/0021* (2013.01); *G01R 19/16542* (2013.01); *Y02T 10/7055* (2013.01)

(58) Field of Classification Search
CPC ........... Y02E 60/12; H02J 7/14; H02J 7/0068; H01M 10/441; H01M 10/44
USPC ....................................................... 320/162
See application file for complete search history.

(56) References Cited

U.S. PATENT DOCUMENTS

| | | | |
|---|---|---|---|
| 6,377,024 B1 | 4/2002 | Choy | |
| 6,577,105 B1 | 6/2003 | Iwaizono | |
| 8,415,918 B2* | 4/2013 | Tonegawa | B60L 8/003 320/109 |
| 2002/0008495 A1* | 1/2002 | Dougherty | G08B 29/181 320/104 |
| 2002/0079868 A1* | 6/2002 | Gaza | H02J 7/0031 320/155 |
| 2002/0149346 A1* | 10/2002 | Sakakibara | H02J 7/0031 320/162 |
| 2003/0015995 A1* | 1/2003 | Tamura | H02J 7/0026 320/162 |
| 2003/0025480 A1* | 2/2003 | Pannwitz | H02J 7/0031 320/134 |
| 2003/0044689 A1* | 3/2003 | Miyazaki | H02J 7/0026 429/320 |
| 2007/0145944 A1 | 6/2007 | Poff | |
| 2010/0013437 A1 | 1/2010 | Poff | |

FOREIGN PATENT DOCUMENTS

EP 1 107 344 6/2001

OTHER PUBLICATIONS

International Search Report dated May 29, 2013 in PCT/FR13/050652 filed Mar. 26, 2013.
French Search Report dated Feb. 11, 2013 in French Application 1200971 filed Mar. 30, 2012.

* cited by examiner

Primary Examiner — Arun Williams
(74) Attorney, Agent, or Firm — Oblon, McClelland, Maier & Neustadt, L.L.P.

(57) ABSTRACT

The invention relates to a system for managing the charging of at least one cell of a storage battery, comprising: two separate means for comparing the voltage across the terminals of said cell with a threshold voltage; and two separate controlling means adapted to control two actuators, respectively, in order to interrupt the charging of the storage battery when said first or second comparing means detects that the voltage across the terminals of said cell exceeds the threshold voltage. One of the actuators is formed by a charger that is connected to said storage battery in order to recharge said cells.

12 Claims, 1 Drawing Sheet

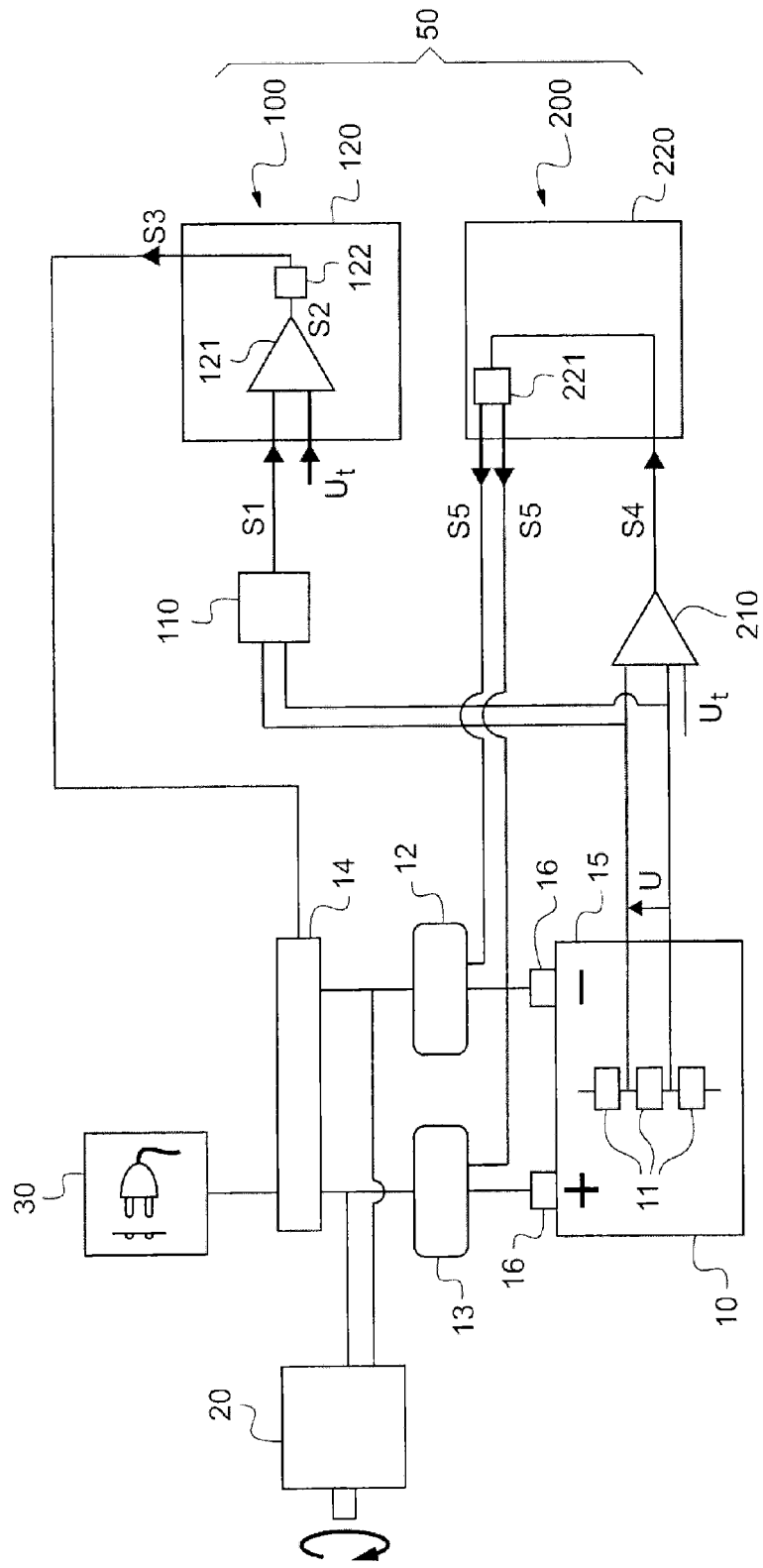

SYSTEM FOR MANAGING THE CHARGING OF A STORAGE BATTERY

TECHNICAL FIELD OF THE INVENTION

The present invention generally relates to the charging of a storage battery.

It relates more particularly to a system for managing the charging of at least one cell of a storage battery, including:
- a first means for comparing the voltage at the terminals of said cell with a threshold voltage, and
- a first control means for controlling a first actuator in order to interrupt the charging of the storage battery when said first comparing means detects that the voltage at the terminals of said cell is greater than said threshold voltage.

TECHNOLOGICAL BACKGROUND

Electric drive motor vehicles are generally provided with a dedicated storage battery, commonly called a traction battery, and with an electric motor supplied with current by this traction battery.

This traction battery is formed from a plurality of storage cells of small sizes, the number of which is calculated such that the electric motor can develop a torque and a power that are sufficient to propel the vehicle for a predetermined duration.

These storage battery cells are generally stacked in a particularly compact manner, and are housed in a hermetically sealed storage casing.

During charging of the cells, the occurrence of an overvoltage can then cause the storage battery to ignite, or even the storage casing to explode.

This overvoltage is particularly dangerous when the motor vehicle is charging at night in a garage attached to a dwelling.

In this case, it is known to provide a management system as defined in the introduction, which can detect such an overvoltage and then stop the charging of the storage battery.

The international standard ISO-26262 allows the degree of danger of an event occurring on a motor vehicle to be quantified, via an ASIL coefficient. This coefficient therefore allows the determination of the risks of non-shutdown of the charging of the storage battery at a place of residence in the case of overvoltage of a cell.

Currently, with regard to the risks of failure of the components used for the manufacture of the management systems, the management systems of the aforementioned type obtain an ASIL C coefficient for the event in question.

The applicant wishes, however, to further reduce the risks of ignition of the storage cells, and therefore obtain a stricter ASIL D coefficient. Unfortunately, even if the applicant used more reliable components, the architecture of the aforementioned management system would not allow such an ASIL D coefficient to be obtained.

SUBJECT MATTER OF THE INVENTION

To obtain such an ASIL D coefficient, a management system as defined in the introduction is then proposed, in which:
- a second means for comparing the voltage at the terminals of said cell with said threshold voltage is provided, which means is separate from said first comparing means, and
- a second control means is provided, which is separate from said first control means and which is suitable for controlling a second actuator in order to interrupt the charging of the storage battery when said second comparing means detects that the voltage at the terminals of said cell is greater than said threshold voltage. According to the invention, the first actuator is formed by a charger that is connected to said storage battery in order to recharge said cells.

Therefore, thanks to the invention, two separate routes are used in parallel to measure, compare and interrupt the charging of the storage battery. It is, then, highly unlikely that the components used in both the routes will simultaneously fail. Therefore, this provides an equivalent reduction of the risks of non-detection of an overvoltage and of ignition of the storage battery.

Other advantageous and nonlimiting features of the management system in accordance with the invention are as follows:
- said second actuator includes at least one relay located between one of the terminals of the storage battery and one of the terminals of a charger;
- said first and second control means are part of a first microprocessor and a second microprocessor of different types, respectively; it is noted in this case that one and/or the other of the microprocessors can be formed by more autonomous components such as microcontrollers;
- said first and second comparing means include a first analog-digital interface and a second analog-digital interface of different types, respectively;
- said first analog-digital interface digitizes the voltage at the terminals of said cell and transmits it to a comparator which compares the digitized voltage with the threshold voltage;
- said comparator is part of the first microprocessor;
- said second analog-digital interface is suitable for carrying out an analog comparison of the voltage at the terminals of said cell and the threshold voltage and for transmitting a digitized signal dependent upon the result of said comparison;
- said first actuator is separate from said second actuator;
- said second actuator includes two relays located between the two terminals of the charger and the two terminals of the storage battery, respectively.

DETAILED DESCRIPTION OF AN EMBODIMENT

The following description with reference to the appended drawing, given by way of nonlimiting example, will explain the features of the invention and how it can be produced.

In this drawing, FIG. 1 is a schematic view of a power train and of a system for managing charging of a storage cell of this power train.

FIG. 1 therefore shows a power train 1.

This power train 1 includes an electric motor 20 designed to propel a motor vehicle, and a traction battery 10 dedicated to supplying this electric motor 20 with current.

This traction battery 10 includes a storage casing 15 from which emerge two phase and neutral terminals 16, and a plurality of storage cells 11 of small sizes, which are housed inside the storage casing 15 and which are connected in series between the phase and neutral terminals 16 of the traction battery 10.

In this case, these storage cells 11 are lithium-ion cells. Once charged, each of these storage cells 11 has a voltage at the terminals thereof between 3.5 and 4.5 V.

For the clarity of FIG. 1, only three storage cells 11 have been shown. The traction battery 10 will, of course, include a greater number thereof.

The number of storage cells 11 will then be calculated such that the electric motor 20 can develop a torque and a power that are sufficient to propel the vehicle for a predetermined duration.

Typically, one hundred storage cells 11 will be used such that the voltage at the phase and neutral terminals 16 of the traction battery 10 is approximately 400 V.

The power train 1 furthermore includes two relays 12, 13 which are connected to the two phase and neutral terminals 16, respectively, of the traction battery 10, between the traction battery 10 and the electric motor 20.

These two relays 12, 13 can be controlled between a closed state (general case) and an open state (in the case of a problem).

The power train 1 also includes a charger 14 including two electric current supply inputs and two output terminals. These two output terminals are connected to the two phase and neutral terminals 16, respectively, of the traction battery 10, via the two relays 12, 13.

It is therefore understood that opening the relays 12, 13 allows the charging of the traction battery 10 to be stopped in the case of a problem.

One of the inputs of the charger 14 is connected to an electric plug 30 which can be plugged into an outlet.

When charging the traction battery 10, an overvoltage can occur at the terminals of one of the storage cells 11. Such an overvoltage can then cause the traction battery 10 to ignite.

To prevent such ignition, a management system 50 is then provided, which allows the charging of the traction battery 10 to be interrupted as soon as an overvoltage is detected at the terminals of one of the storage cells 11.

For the clarity of FIG. 1 and of this disclosure, only part of this management system 50, which applies to only one of the storage cells 11, has been shown and described. Of course, this management system 50 will apply in the same manner to the other storage cells 11.

According to the invention, in order to prevent any failure in the detection of an overvoltage, the management system 50 is duplicated, in the sense that it includes two separate routes 100, 200 in order to compare the voltage U at the terminals of the storage cell 11 in question with a threshold voltage Us and order the interruption of charging in the case of overvoltage.

The routes for detecting the overvoltages and the actuators use different technologies in order to prevent systematic breakdown.

The routes are completely independent so as to prevent an undetected breakdown from being able to simultaneously affect both routes.

In this case, the threshold voltage Us is 4.2 V. Therefore, an overvoltage is detected as soon as the voltage U at the terminals of the storage cell 11 in question exceeds 4.2 V.

The first route 100 therefore includes:
means 110, 121 for measuring the voltage U at the terminals of the storage cell 11 in question and for comparing the measured voltage U with the threshold voltage Us, and
a control means 122 for controlling a first actuator in order to interrupt the charging of the traction battery 10 in the case of overvoltage detected by the means 110, 121.

This first route 100 more precisely includes two electronic components, namely an analog-digital interface 110 and a microcontroller 120.

The analog-digital interface 110 is suitable for digitizing the voltage U measured at the terminals of the storage cell 11 in question. This analog-digital interface 110 is, in this case, formed by a MAX17830 sensor manufactured by the company MAXIM. Therefore, it measures, at input, the potential at each of the terminals of the storage cell 11 in question and transmits, at output, at regular intervals (in this case every 10 ms), a signal S1 which comprises the digitized value of the voltage U.

The microcontroller 120 then has two functions. Firstly, it includes a comparator function 121 in order to compare the voltage U transmitted by the analog-digital interface 110 with the threshold voltage Us and to transmit a warning signal S2 if an overvoltage is detected for a predetermined duration (for example 2 ms). It also includes a control function 122 in order to generate, in the case of overvoltage, a signal S3 for controlling the first actuator. The microcontroller 120 used in this case has the reference STM32F105RCT6 and is manufactured by the company STMICROELECTRONICS.

It will be noted that this first route 100 of the management system 50 is not dedicated to monitoring the overvoltages, but that the components thereof are also used for other purposes, particularly for determining the capacity of the storage battery.

The second route 200 includes:
means 210 for measuring and comparing the voltage U at the terminals of the storage cell 11 with the threshold voltage Us, and
a control means 221 for controlling a second actuator in order to interrupt the charging of the traction battery 10 in the case of overvoltage detected by the measuring and comparing means 210.

This second route 200 more precisely includes two electronic components, namely an analog-digital interface 210 and a microcontroller 220.

The analog-digital interface 210 is suitable for carrying out an analog comparison of the voltage U measured at the terminals of the storage cell 11 and the threshold voltage Us. This analog-digital interface 210 is, in this case, formed by a bq77PL660Q1 sensor manufactured by the company TEXAS INSTRUMENTS. Therefore, it measures, at input, the potential at each of the terminals of the storage cell 11 in question and transmits, at output, at regular intervals (in this case every 10 ms), a warning signal S4 in the case of overvoltage.

The microcontroller 220 has a control function 221 in order to generate, in the case of overvoltage for a predetermined duration (in this case 2 ms), a signal S5 for controlling the second actuator. The microcontroller 220 used in this case has the reference MC9S12HZ256J3CAL and is manufactured by the company INFINEON.

It will be noted that this second route 200 of the management system 50 is dedicated to monitoring the overvoltages, and that the components thereof are therefore not used for other purposes.

The control signals S3, S5 transmitted by the microcontrollers 120, 220 then allow the charging of the traction battery 10 to be interrupted in the case of overvoltage at the terminals of the storage cell 11.

To this end, these control signals S3, S5 are transmitted to said first and second actuators.

It could then be envisaged that these actuators are merged and formed, for example, by the charger, which would then be controlled by the two microcontrollers in order to stop the charging of the traction battery.

However, in this case, in order to further reduce the risk of failure in the chain for detecting the overvoltages and for stopping the charging of the traction battery 10, the two actuators are separate from one another. Therefore, if one of the actuators fails, the charging of the traction battery 10 can be stopped by the other actuator.

As shown in FIG. 1, the first actuator, controlled by the first route 100 of the management system 50, is formed by the charger 14.

The second actuator, controlled by the second route 200 of the management system 50, is formed by at least one of the two relays 12, 13. In this case, it is formed from the two relays 12, 13.

When the storage battery 10 is charging on an outlet, the management system 50 then functions in the following manner.

On the first route 100, the analog-digital interface 110 digitizes, at regular intervals (in this case every 10 ms), the voltage U measured at the terminals of the storage cell 11 and then transmits the signal S1 to the microcontroller 120.

The comparator 121 of the microcontroller 120 then compares, each time it receives the signal S1, the measured voltage U with the threshold voltage Us.

While this measured voltage U remains lower than the threshold voltage Us, no signal is delivered by the comparator 121.

By contrast, if an overvoltage is detected by the comparator 121, the latter transmits the warning signal S2 such that the microcontroller 120 transmits the signal S3 for ordering the charger 14 to stop.

On the second route 200, the analog-digital interface 210 continuously compares the voltage U measured at the terminals of the storage cell 11 with the threshold voltage Us.

While this measured voltage U remains less than the threshold voltage Us, no signal is delivered by the analog-digital interface 210.

By contrast, if an overvoltage is detected by the analog-digital interface 210, the latter transmits, at regular intervals (in this case every 10 ms), the warning signal S4 to the microcontroller 220. When this signal S4 is received four times in a row (in 2 ms), the microcontroller 220 transmits the signal S5 for ordering the relays 12, 13 to open.

Therefore, the overvoltage does not extend over a duration which is sufficient to cause the ignition of the storage cell 11.

In the case of failure of one or the other of the components of one of the routes 100, 200 of the management system 50, the other route of the management system will then alone allow the charging of the traction battery 10 to be interrupted.

The probability of a simultaneous failure of the route 100 linked with the charger 14 thereof and of the route 200 linked with the relays 12 and 13 thereof is then extremely reduced.

The charger 14 normally has an ASIL B coefficient according to the international standard ISO-26262, which means that:
the undetected failure risk thereof is less than $10^{-3}$ FIT (unit measuring the number of failures of a component per billion hours of operation), and
on all of the components, the proportion of faults of no consequence over the sought goal (SPFM) is greater than 90%.

The relays 13 and 14 normally have ASIL B coefficients according to the international standard ISO-26262, which means that:
the undetected failure risk thereof is less than $10^{-3}$ FIT, and
on all of the components, the proportion of faults of no consequence over the sought goal (SPFM) is greater than 90%.

Having chosen components for the route 100, the sum of the failure risks of which is less than $9.10^{-3}$ FIT, a failure risk less than $10^{-2}$ FIT is obtained for the route 100 linked with the charger 14 thereof.

Likewise, having chosen components for the route 200, the sum of the failure risks of which is less than $9.10^{-3}$ FIT, an undetected failure risk less than $10^{-2}$ FIT is obtained for the route 200 linked with the relays 12, 13 thereof.

The risk of undetected simultaneous failures both on the route 100 and the charger 14 thereof and on the route 200 and the relays 12, 13 thereof is less than $10^{-4}$ FIT.

Thanks to the independence of the two branches, the risk of undetected failure of the overall system, made up of the route 100 linked with the charger 14 thereof and of the route 200 linked with the relays 12, 13 thereof, is then less than $10^{-4}$ FIT.

The components of the route 100 have, moreover, been chosen such that, on the entirety of the route 100, the proportion of faults of no consequence over the sought goal (SPFM) is greater than 90%.

Likewise, the components of the route 200 have been chosen such that, over the entirety of the route 200, the proportion of faults of no consequence over the sought goal (SPFM) is greater than 90%.

Thanks to the independence of the two branches thereof, the system made up of the route 100 linked with the charger 14 thereof and of the route 200 linked with the relays 12, 13 thereof then has the following features:
the proportion of faults of components of no consequence over the sought goal (SPFM) is greater than 99%, and
the proportion of faults of components which, alone or coupled with another fault of one of the components, is without consequence over the sought goal (LFM) is greater than 90%.

According to the international standard ISO-26262, the management system 50 then has an ASIL D coefficient, which illustrates the reliability thereof.

The present invention is in no way limited to the described and shown embodiment, but a person skilled in the art can apply thereto any alternative in accordance with the spirit thereof.

It could particularly be envisaged that the first route controls the opening of the relays, while the second route controls the stopping of the charger.

Moreover, it could be envisaged that the comparator 121 of the first route is not incorporated into the microcontroller, but that it forms an autonomous component located between the analog-digital interface and the microcontroller.

The invention claimed is:
1. A system for managing the charging of at least one cell of a storage battery, including:
a charger configured to charge said storage battery; and
first circuitry configured to
compare voltage at terminals of said at least one cell with a threshold voltage, and
control the charger connected to said storage battery to stop charging the storage battery when the first circuitry detects that the voltage at the terminals of said at least one cell is greater than said threshold voltage, second circuitry, separate from the first circuitry, configured to compare the voltage at the terminals of said at least one cell with said threshold voltage, and control at least one relay to an open state to prevent the charging of the storage battery by said charger when the second circuitry detects that the voltage at the terminals of said at least one cell is greater than said threshold voltage.

2. The management system as claimed in claim 1, wherein said at least one relay is located between one of terminals of the storage battery and one of terminals of the charger connected to said storage battery in order to recharge said cells.

3. The management system as claimed in claim 2, wherein said first and second circuitry are part of a first microprocessor and a second microprocessor having different architectures, respectively.

4. The management system as claimed in claim 1, wherein said first and second circuitry include a first analog-digital interface and a second analog-digital interface having different architectures, respectively.

5. The management system as claimed in claim 4, wherein said first analog-digital interface digitizes the voltage at the terminals of said at least one cell and transmits the voltage to a comparator which compares the digitized voltage with the threshold voltage.

6. The management system as claimed in claim 5, wherein said comparator is part of the first circuitry.

7. The management system as claimed in claim 4, wherein said second analog-digital interface is configured to carry out an analog comparison of the voltage at the terminals of said at least one cell and the threshold voltage and to transmit a digitized signal dependent upon the result of said comparison.

8. The management system as claimed in claim 1, wherein said charger is separate from said at least one relay.

9. The management system as claimed in claim 1, wherein said at least one relay includes two relays located between two terminals of the charger and two terminals of the storage battery, respectively.

10. A system for managing the charging of at least one cell of a storage battery, including:

a first means for comparing the voltage at terminals of said at least one cell with a threshold voltage, and a first control means for controlling a charger to stop charging the storage battery when said first comparing means detects that the voltage at the terminals of said at least one cell is greater than said threshold voltage, a second means for comparing the voltage at the terminals of said at least one cell with said threshold voltage, which means is separate from said first comparing means, and a second control means, which is separate from said first control means and which is suitable for controlling at least one relay to an open state to prevent the charging of the storage battery by the charger when said second comparing means detects that the voltage at the terminals of said at least one cell is greater than said threshold voltage, wherein said charger is connected to said storage battery in order to recharge said cells.

11. A method for managing the charging of at least one cell of a storage battery, including:

comparing via first circuitry, voltage at terminals of said at least one cell with a threshold voltage, and controlling, via the first circuitry, a charger to stop charging the storage battery when the first circuitry detects that the voltage at the terminals of said at least one cell is greater than said threshold voltage, comparing, at second circuitry separate from the first circuitry, the voltage at the terminals of said at least one cell with said threshold voltage, and controlling, via the second circuitry, at least one relay to an open state to prevent the charging of the storage battery by the charger when the second circuitry detects that the voltage at the terminals of said at least one cell is greater than said threshold voltage, wherein said charger is connected to said storage battery in order to recharge said cells.

12. The system as claimed in claim 1, wherein the first circuitry and second circuitry check the voltage at the terminals of said at least one cell at different intervals.

* * * * *